(12) United States Patent
Peijster et al.

(10) Patent No.: US 9,703,213 B2
(45) Date of Patent: Jul. 11, 2017

(54) SUBSTRATE PROCESSING APPARATUS

(75) Inventors: Jerry Johannes Martinus Peijster, Maartensdijk (NL); Diederik Geert Femme Verbeek, Pijnacker (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/342,542

(22) PCT Filed: Sep. 12, 2012

(86) PCT No.: PCT/EP2012/067879
§ 371 (c)(1),
(2), (4) Date: Jun. 23, 2014

(87) PCT Pub. No.: WO2013/037856
PCT Pub. Date: Mar. 21, 2013

(65) Prior Publication Data
US 2014/0347640 A1 Nov. 27, 2014

Related U.S. Application Data

(60) Provisional application No. 61/533,362, filed on Sep. 12, 2011.

(51) Int. Cl.
*G03B 27/52* (2006.01)
*G03F 7/20* (2006.01)
(Continued)

(52) U.S. Cl.
CPC .......... *G03F 7/70891* (2013.01); *B82Y 10/00* (2013.01); *B82Y 40/00* (2013.01);
(Continued)

(58) Field of Classification Search
CPC G03F 7/70891; G03F 7/709; H01J 2237/002; H01J 2237/0216; H01J 2237/28; H01J 37/02; H01J 37/3177
See application file for complete search history.

(56) References Cited

U.S. PATENT DOCUMENTS 4,852,133 A 7/1989 Ikeda et al.
6,537,041 B2 * 3/2003 Lee ..................... F04B 39/0044
248/617
(Continued)

FOREIGN PATENT DOCUMENTS

EP 0856872 8/1998
EP 1376239 A2 1/2004
(Continued)

*Primary Examiner* — Deoram Persaud
(74) *Attorney, Agent, or Firm* — Hoyng Monegier LLP; David P. Owen

(57) ABSTRACT

The invention relates to a substrate processing apparatus (10) comprising a support frame (60), a radiation projection system (20) for projecting radiation onto a substrate to be processed, a substrate support structure (30) for supporting the substrate, and a fluid transfer system (150). The radiation projection system comprises a cooling arrangement (130) and is supported by and vibrationally decoupled from the support frame such that vibrations of the support frame above a predetermined maximum frequency are substantially decoupled from the radiation projection system. The fluid transfer system comprises at least one tube (140) fixed at two points (151,152), and comprises a flexible portion. A substantial part of the flexible portion extends over a plane substantially parallel to the substrate support structure surface. The stiffness of the flexible portion is adapted to substantially decouple vibrations at the second fixed point which are above the predetermined maximum frequency from the first fixed point.

33 Claims, 6 Drawing Sheets

(51) Int. Cl.
*H01J 37/02* (2006.01)
*H01J 37/317* (2006.01)
*B82Y 10/00* (2011.01)
*B82Y 40/00* (2011.01)

(52) U.S. Cl.
CPC .............. *G03F 7/709* (2013.01); *H01J 37/02* (2013.01); *H01J 37/3177* (2013.01); *H01J 2237/002* (2013.01); *H01J 2237/0216* (2013.01); *H01J 2237/28* (2013.01)

(56) References Cited

U.S. PATENT DOCUMENTS

| | | | |
|---|---|---|---|
| 7,965,456 B2* | 6/2011 | Egle | B82Y 10/00 359/820 |
| 2002/0027645 A1 | 3/2002 | Shiraishi | |
| 2003/0234918 A1 | 12/2003 | Watson | |
| 2004/0046947 A1 | 3/2004 | Yuan et al. | |
| 2004/0051984 A1 | 3/2004 | Oshino et al. | |
| 2004/0160586 A1 | 8/2004 | Nishi | |
| 2005/0161621 A1* | 7/2005 | Wieland | B82Y 10/00 250/492.23 |
| 2005/0175474 A1* | 8/2005 | Lee | F04B 39/127 417/363 |
| 2005/0248739 A1 | 11/2005 | Box et al. | |
| 2007/0199201 A1 | 8/2007 | Tanaka | |
| 2009/0086178 A1 | 4/2009 | Shibazaki | |
| 2009/0147228 A1* | 6/2009 | Ono | G03F 7/70808 355/53 |
| 2009/0169661 A1* | 7/2009 | Vermeulen | G03F 7/70716 425/102 |
| 2009/0190117 A1* | 7/2009 | Ono | G03F 7/70833 355/67 |
| 2011/0174985 A1 | 7/2011 | Peijster | |
| 2011/0267590 A1* | 11/2011 | Rodak | G03F 7/70991 355/30 |
| 2012/0180828 A1 | 7/2012 | Higashijima et al. | |

FOREIGN PATENT DOCUMENTS

| | | |
|---|---|---|
| JP | 09 089417 | 4/1997 |
| JP | 2001 006592 | 1/2001 |
| JP | 2001 006592 A | 1/2001 |
| JP | 2002 198284 A | 7/2002 |
| JP | 2002 203776 | 7/2002 |
| JP | 2004 304145 | 10/2004 |
| JP | 2009 176794 | 8/2009 |
| WO | WO 2004 107050 A2 | 12/2004 |
| WO | WO 2006 038952 A2 | 4/2006 |
| WO | WO 2009 127658 A1 | 10/2009 |

* cited by examiner

SUBSTRATE PROCESSING APPARATUS

BACKGROUND OF THE INVENTION

1. Field of the Invention

The invention relates to a substrate processing apparatus, such as a lithographic apparatus or an inspection apparatus.

2. Description of the Related Art

In the semiconductor industry, an ever increasing desire exists to manufacture smaller structures with high accuracy and reliability. In lithography systems this desire results in extremely high demands with respect to positioning and orientation. External vibrations caused by other machines in a fab environment and/or electrical circuitry may have a negative influence on the positioning accuracy within the lithographic apparatus. Similarly, vibrations within a lithographic apparatus, for example caused by stage movement, may have a negative influence on such accuracy.

Reduction of vibrations may be realized by isolating the source and the components used to manipulate the radiation, i.e. a radiation projection system or "column", from the environment. Similarly, the substrate to be processed, in combination with the support structure on which the substrate is placed, may be vibrationally decoupled from the stage. Vibration decoupling may be achieved using bearings, spring elements and/or other components. The precise selection and placement of such components depends on the design at hand.

The reduction of feature sizes in combination with the desire to maintain the present day throughput in semiconductor processing, often results in an increased heat load for both the substrate support structure and components within the radiation projection system of the semiconductor processing apparatus. In some cases, active cooling by means of a cooling fluid running through one or more conduits, is desirable to obtain sufficient cooling. Unfortunately, the use of cooling conduits largely undoes the vibration decoupling of the element being cooled.

BRIEF SUMMARY OF THE INVENTION

It is desirable to provide active cooling to a radiation projection system within a substrate processing apparatus, such as a lithographic apparatus or inspection apparatus, without jeopardizing the design of the apparatus with respect to vibrational decoupling from external vibrations. For this purpose, an embodiment of the invention provides a substrate processing apparatus, such as a lithographic apparatus or an inspection apparatus, comprising: a support frame; a radiation projection system for projecting radiation onto a substrate to be processed, the radiation projection system comprising a cooling arrangement and being supported by and vibrationally decoupled from the support frame such that vibrations of the support frame above a predetermined maximum frequency are substantially decoupled from the radiation projection system; and a substrate support structure with a surface for supporting the substrate to be processed; the substrate processing apparatus further comprising a fluid transfer system for providing fluid to and removing fluid from the cooling arrangement of the radiation projection system, wherein the fluid transfer system comprises at least one tube fixed at at least two points within the apparatus, the fluid transfer system comprising a flexible portion extending between the two fixed points and including at least one tube, a first one of the fixed points being fixed relative to the radiation projection system and a second one of the fixed points being moveable relative to the radiation projection system, wherein at least a substantial part of the flexible portion extends in two dimensions over a plane substantially parallel to the surface of the substrate support structure for supporting the substrate to be processed, and wherein the stiffness of the flexible portion between the two points is adapted to substantially decouple vibrations at the second fixed point which are above the predetermined maximum frequency from the first fixed point. The use of a fluid transfer system with a flexible portion of which a substantial part extending in a plane substantially parallel to the radiation receiving surface of a substrate to be processed and with a stiffness resulting in a sufficient attenuation of vibrations above a predetermined maximum frequency enables the maintaining of an effective decoupling of vibrations of the radiation projection system from the support frame while allowing the supply of fluid to the radiation projection system, for example for cooling purposes. In embodiments where a moveable substrate support structure is used, the predetermined maximum frequency may depend on the maximum frequency that can be followed by the control system. In some embodiments, the second one of the fixed points is fixed relative to the support frame.

The flexible portion of the fluid transfer system may have a predetermined maximum stiffness, for example a predetermined maximum stiffness lower than 500 N/m, more preferably lower than 400 N/m. The maximum stiffness may be determined by the design requirements of the system at hand.

Providing a predetermined stiffness for the flexible portion of the fluid transfer system may include different selections of suitable parameters and conditions. For example, the length, diameter and wall thickness of the at least one tube may be suitably selected. Alternatively, or additionally, the curvature of the at least one tube may be suitably selected. Furthermore, as the stiffness of the flexible portion may depend on the fluid that is transferred through the fluid transfer system during operational use, the fluid transfer system may comprise a fluid supply system for regulating parameters of the fluid flow in the fluid transfer system. Exemplary parameters include, but are not limited to fluid type, fluid volume and fluid pressure.

Suitable materials for the at least one tube would be perfluoroalkoxy (PFA) and polytetrafluoroethylene (PTFE), the latter being known under the trade name Teflon®. In some embodiments, PFA is preferred because it is melt-processable using conventional processing techniques including but not limited to injection molding and screw extrusion.

In some embodiments, the support frame, the radiation projection system, the substrate support structure and the fluid transfer system are placed in a vacuum chamber. In such embodiments, the extent of heat removal away from the radiation projection system may almost entirely depend on the capacity and performance of the fluid transfer system because active heat removal is about the only effective heat transfer mechanism available.

The at least one tube may be oriented in a curved fashion in the plane substantially parallel to the surface of the substrate support structure. In some embodiments, the at least one tube may form a loop. Preferably, the curvature of the at least one tube substantially corresponds to the natural curvature of the at least one tube obtained during fabrication thereof. By using the natural curvature of the tube vibrations may be attenuated most effectively. Furthermore, resilient forces attempting to reshape the tube in its natural way are absent.

In some embodiments, the apparatus comprises at least one suspension holder comprising a support structure for holding the at least one tube at a location along its length, the support structure being vibrationally decoupled from the support frame for vibrations in a direction within the plane substantially parallel to the surface of the substrate support structure, as well as in a rotational direction about an axis substantially perpendicular to that plane. Such suspension holder limits tube bending under the influence of gravity.

In some embodiments, the fluid transfer system comprises a plurality of tubes. The tubes may have different diameters. If a suspension holder is used, the tubes with the larger diameter may be more centrally supported to increase the stability of the flexible portion of the fluid transfer system as compared to an arrangement in which these tubes are supported at a less central position.

The end portions of the at least one tube may be oriented in a direction substantially perpendicular to the plane of the surface of the substrate support structure for supporting the substrate to be processed. Such orientation may reduce the footprint of the fluid transfer system.

In some embodiments of the invention, the at least one tube comprises at least two straight portions and at least one corner portion between the two points, wherein the at least two straight portions are flexible compared to the at least one corner portion, and wherein the length of the straight portions makes up a largest part of the length of the at least one tube. The relatively flexible straight portions enable vibrational decoupling, whereas the relatively stiff corner portion provides sufficient structural integrity to transfer fluid through the fluid transfer system in a reliable and controllable fashion. The use of more than one tube may improve homogeneous spreading of fluid throughout the radiation projection system.

Preferably, the lengths of the straight portions make up a largest part of the tube lengths. To obtain a fluid transfer system with limited stiffness, preferably, the lengths of the straight portions make up a largest part of the tube lengths, for example at least 70%. The straight portions of each tube are preferably free of contacting straight portions of other tubes to minimize tube-tube interactions.

In some embodiments, the at least one corner portion comprises a stiffening member provided with an opening for transferring fluid around a corner. The stiffening member helps to strengthen the corner portion so that the corner portion can sustain a pressure increase when fluid runs through the one or more tubes. In some circumstances, a stiffening member may be needed to prevent tube straightening as a result of such pressure increase. The stiffening member may be connected to the support frame by means of a spring element to obtain sufficient structural integrity in combination with a vibrational decoupling of the stiffening member from the support frame. The stiffening member may comprise aluminum.

In some embodiments, the support frame, the radiation projection system, the substrate support structure, and the fluid transfer system are placed in a vacuum chamber. Many substrate processing applications, such as electron beam lithography, require substrate processing under vacuum conditions. The fluid transfer system may then be surrounded by a housing to limit a flow from particles released from the tubes towards into the vacuum. The housing may be a tubular housing suitable for accommodating the fluid transfer system.

At an end at which the one or more tubes are attached to the cooling arrangement, the housing may be provided with a membrane for separating a space within the housing from external influences, the membrane being provided with one or more openings through which the one or more tubes protrude. The membrane further avoids the spreading of particles originating from the fluid transfer system into the vacuum. The membrane may be provided with flexible portions in areas within the openings, wherein the flexible portions extend from the membrane onto the tubes. The flexible portions ensure a vibrational decoupling between the membrane and the tubes, as well as further reduce the flow of contaminants from the space within the housing towards a vacuum environment. Alternatively, or additionally, particle contamination may be reduced by providing the housing with an outlet that is connectible to a pump, preferably a vacuum pump.

In some embodiments, the apparatus further comprises: a support body for accommodating the radiation projection system; and an intermediate body connected to the support frame by means of at least one spring element; wherein the support body is connected to the intermediate body by means of at least one pendulum rod. The at least one spring element may be a leaf spring. A leaf spring has well-defined vibrational properties. The leaf spring may comprise at least two substantially parallel elongated plates. The thickness and length of these plates largely determine the eigenfrequency of the leaf spring. In some embodiments, the support body is provided with side walls surrounding the radiation projection system, wherein the side walls comprising a shielding material for shielding the radiation projection system from external electromagnetic fields.

The radiation projection system may be a multi-beamlet charged particle lithographic apparatus. In particular, such multi-beamlet charged particle lithographic apparatus may comprise: a beam generator for generating a plurality of charged particle beamlets; a beamlet blanker array for patterning the plurality of beamlets in accordance with a pattern; and a projection system for projecting the patterned beamlets onto a target surface of a substrate provided on the target support structure.

In some embodiments, the substrate support structure is a moveable substrate support structure. The apparatus may then further comprise a control system for moving the substrate support structure with respect to the radiation projection system.

Some embodiments of the invention are related to a substrate processing apparatus, such as a lithographic apparatus or an inspection apparatus, comprising: a support frame; a radiation projection system for projecting radiation onto a substrate to be processed, being supported by and vibrationally decoupled from the support frame such that vibrations of the support frame above a predetermined maximum frequency are substantially decoupled from the radiation projection system; a fluid transfer system for transferring fluid to and removing fluid from the radiation projection system; and a substrate support structure provided with a surface for supporting the substrate to be processed; wherein the fluid transfer system comprises one or more tubes for transferring fluid, wherein a portion of the one or more tubes extends in a two dimensions over a plane substantially parallel to the surface of the substrate support structure for supporting the substrate to be processed. The portion of the one or more tubes may extend over the plane in the form of a loop.

In some embodiments, the apparatus further comprises at least one suspension holder for holding the portion of the one or more tubes extending in two dimensions. Furthermore, an additional support frame that is connected to the support frame may be provided for supporting the at least one suspension holder.

In some embodiments, the radiation projection system comprises a cooling arrangement. In these embodiments, the fluid transfer system is adapted for transferring cooling fluid to and removing cooling fluid from the cooling arrangement. The use of a cooling arrangement is particularly useful in next generation lithography applications, such as lithography applications using a plurality of charged particle beamlets.

BRIEF DESCRIPTION OF THE DRAWINGS

Embodiments of the invention will now be described, by way of example only, with reference to the accompanying schematic drawings in which.

DESCRIPTION OF ILLUSTRATIVE EMBODIMENTS

The following is a description of various embodiments of the invention, given by way of example only and with reference to the figures. The figures are not drawn to scale and are merely intended for illustrative purposes.

Figure 1:
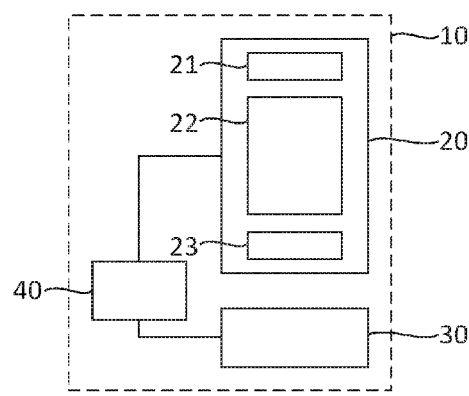
FIG. 1 shows a simplified schematic drawing of a substrate processing apparatus.

FIG. 1 shows a simplified schematic drawing of a substrate processing apparatus 10 that may be used in embodiments of the invention. The substrate processing apparatus 10 comprises a radiation projection system 20 for projecting radiation onto a substrate, such as a wafer, to be processed. The radiation projection system 20 may include a beamlet generator for generating a plurality of beamlets, a beamlet modulator for patterning the beamlets to form modulated beamlets, and a beamlet projector for projecting the modulated beamlets onto a surface of a target. The components within the radiation projection system 20 are typically arranged in a column and are usually referred to as the electron-optical column or optical column, but will be referred to herein as simply the "column". The radiation projection system 20 may be arranged to project any kind of suitable radiation, for example the system 20 may project of charged particle beams, optical beams, or other types of beams.

The substrate processing apparatus 10 further comprises a substrate support structure 30 for supporting the substrate to be processed. The substrate support structure 30 may be a moveable substrate support structure. The apparatus 10 may then further comprise a control system 40 for moving the substrate support structure 30 with respect to the radiation projection system 20. The control system 40 may base the movement on position information obtained by measurements within the radiation projection system 20, for example by the use of interferometry.

Hereafter, embodiments of the invention will be described in relation to a lithographic apparatus, although it may also be applied for an inspection apparatus, and the like. In particular, reference is made to a multi-beam charged particle lithographic apparatus. As schematically shown in FIG. 1, such apparatus comprises a beam generator 21 for generating a plurality of charged particle beamlets, a beamlet blanker array 22 for patterning the plurality of beamlets in accordance with a pattern, and a projection system 23 for projecting the patterned beamlets onto a target surface of a substrate provided on the target support structure. An example of such apparatus may be found in international patent publication WO2009/127658, a copy of which is herein incorporated by reference in its entirety.

Figure 2:
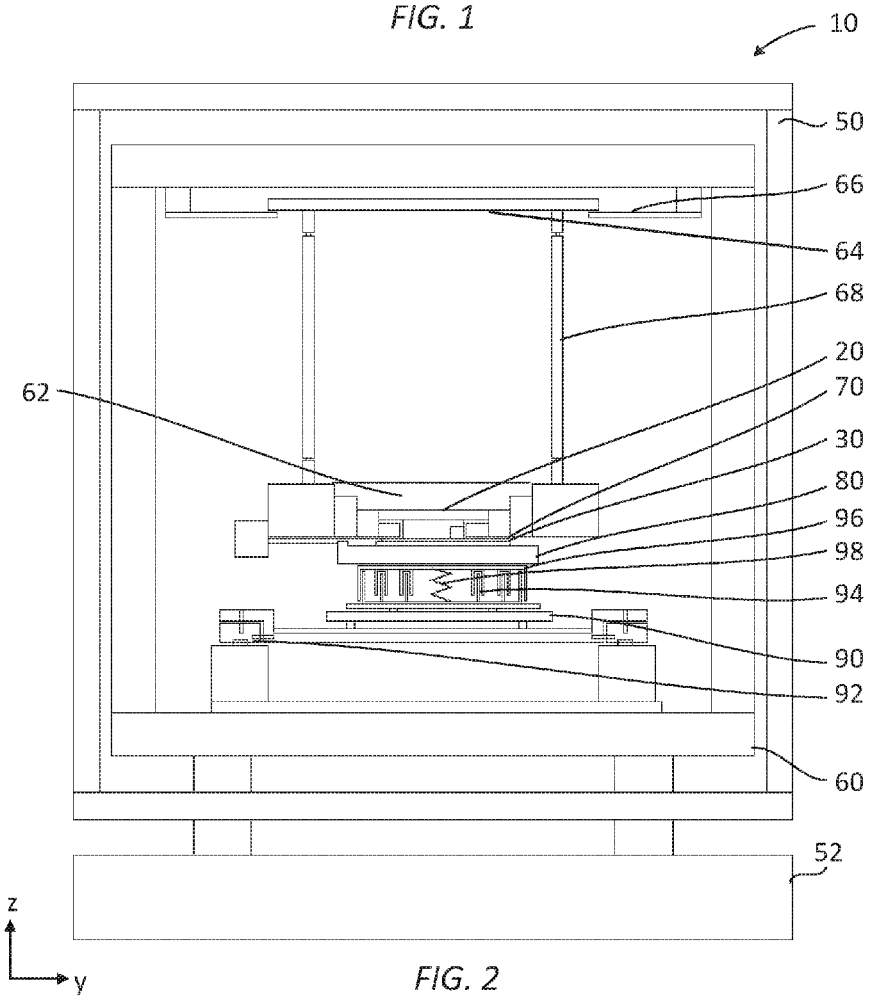
FIG. 2 schematically shows a substrate processing apparatus that may be used in embodiments of the invention.

FIG. 2 schematically shows a substrate processing apparatus 1 that may be used in embodiments of the invention. The vertical direction in FIG. 2 is defined as the z-direction, whereas the horizontal direction shown in FIG. 2 is defined as the y-direction. Additionally, a direction perpendicular to both the y-direction and the z-direction and extending into and out of the paper is defined as the x-direction. Furthermore, a rotational direction corresponding to rotation about an axis directed in the x-direction, i.e. x-axis, is defined as the Rx, a rotational direction corresponding to rotation about an axis directed in the y-direction, i.e. y-axis, is defined as the Ry-direction, and, finally, a rotational direction corresponding to rotation about an axis directed in the z-direction, i.e. z-axis, is defined as the Rz-direction.

In this embodiment, the apparatus 1 comprises a vacuum chamber 50 positioned on top of a base plate 52. The apparatus 1 further comprises a support frame 60 placed within the vacuum chamber 50. The support frame 60 is preferably made of a material with sufficient stiffness to provide support without deformation, for example a suitable metal such as aluminum. Furthermore, in particular in applications using charged particle beamlets, the material is non-magnetic.

The radiation projection system 20, which is only partially shown in FIG. 2, takes the form of a column and is placed in a body 62 for accommodating the column. Body 62 will hereafter be referred to as support body 62. The radiation projection system 20 is further supported by and vibrationally decoupled from the support frame 60. In this embodiment, the support body 62 is connected to the support frame 60 via an intermediate body 64. The intermediate body 64 may take the form of a plate or a number of plates connected to each other. The intermediate body 64 may comprise one or more cut-outs and/or may contain portions of smaller thickness to reduce weight. The material of the intermediate body is preferably a non-magnetic material, preferably a non-magnetic metal. The intermediate body 64 enables a decoupling of vibrations in the z-direction and vibrations in the x, y and Rz-directions.

The support frame 60 is connected to the intermediate body 64 by means of one or more spring elements 66, such as leaf springs. A leaf spring has well-defined vibrational properties and may comprise at least two substantially parallel elongated plates. The thickness and length of these plates largely determine the eigenfrequency of the leaf spring. The spring elements 66 may be provided with damping elements to enable vibrational damping, particularly in the z-direction. The spring elements 66 are arranged for decreasing the influence of external vibrations on the position of the support body 62. By suitable selection of parameters such as shape, size and material of the spring elements 66, the incoupling of particular frequency components in external vibrations may be minimized. In particular, the spring elements 66 enable a decoupling of vibrations in the z-direction as well as vibrations in a rotational direction about the x-direction axis and the y-direction axis, i.e. Rx and Ry respectively.

The support body 62 is also connected to the intermediate body 64. The connection between the body 62 and the body 64 is by means of at least one rod-like structure, further referred to as pendulum rod 68. The at least one pendulum rod 68 should be sufficiently strong to carry the support body 62, which may have a mass of several hundreds of kilograms, and capable of permitting the support body 62 to swing. The intermediate body 64 and/or the support body 62 may be provided with damping elements to dampen vibrations in the horizontal plane and preferably also to dampen vibrations in a rotational direction about the z-direction axis, i.e. Rz.

The intermediate body 64 enables a decoupling of vibrations in the z-direction and vibrations in the x, y and Rz-directions. Furthermore, by suitable positioning of the connection positions of the intermediate body 64 with the spring elements 66, the eigenfrequencies in the z-direction that may couple into the support body 62 may be set. Similarly, by suitable positioning of the one or more connection positions of the intermediate body 64 with the one or more pendulum rods 68, the eigenfrequencies in Rz-direction that can couple into the support body 62 may be set. The eigenfrequencies in the x and y-directions may be set by choosing the length of the one or more pendulum rods 68. Consequently, the use of an intermediate body 64 provides design freedom regarding the setting of eigenfrequencies of the system.

In lithographic application, in particular in case charged particle beamlets are used for exposing of a substrate to be processed, the vibration isolation requirements are generally more strict for x-, y- and Rz-directions than for z-, Rx- and Ry-directions. Vibrations in the x, y and Rz-direction may have a significant influence on beamlet positioning, which may lead to exposure position errors. On the other hand, vibrations in the z, Rx and Ry directions have an influence on the beamlet spot size on the target surface of the substrate to be processed. Charged particle beamlets in lithographic systems preferably have a relatively large depth of focus. Consequently, a small deviation in a direction away from the focal plane is of less significance for the quality and reliability of the exposed pattern, than the exposure position errors discussed above.

In lithographic applications, preferably, the eigenfrequencies in the z-direction are chosen to be below 15 Hz, preferably below 5 Hz, whereas the eigenfrequencies in the x, y and Rz-directions are chosen to be below 3 Hz, preferably below 1 Hz. Specific choices of eigenfrequencies may depend on the bandwidth of the system responsible for compensating vibrations, for example control system 40.

The substrate support structure 30, which carries a substrate 70 to be processed, is placed on top of a chuck 80. The chuck 80 is provided on top of a Y-stage 90 for moving the chuck 80 in the y-direction, and an X-stage 92 arranged for movement in the x-direction.

In the shown embodiment, the Y-stage 90 comprises positioners 94 for moving a member 96 in the Y-direction. The positioners 94 typically take the form of electromotors, preferably linear motors, preferably comprising Lorentz-type actuators. In a Lorentz-type actuator the applied force is linearly proportional to the current and the magnetic field. Furthermore, the Y-stage 90 is provided with a gravity compensation spring 98 for decoupling vibrations in the support frame 60 from the substrate support structure 30 and the substrate 70 provided thereon.

Figure 3:
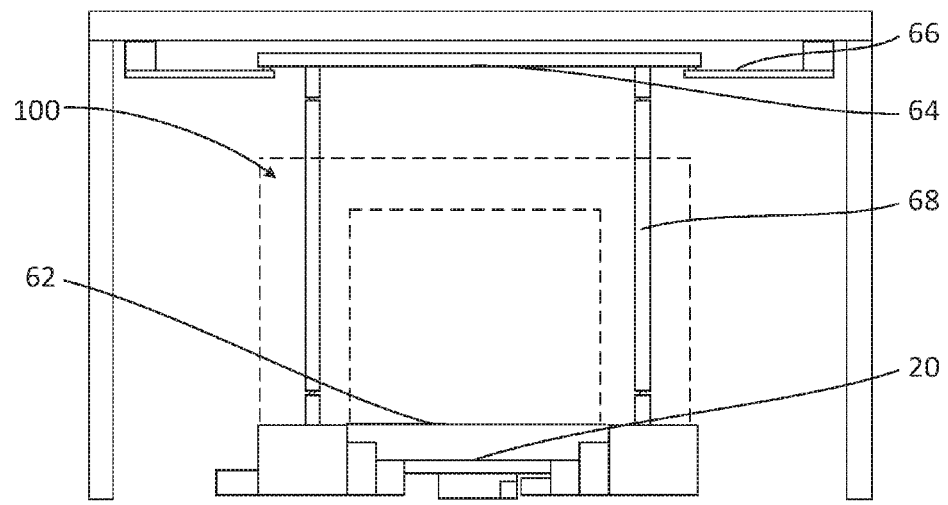
FIG. 3 shows a more detailed view of a portion of the substrate processing apparatus of FIG. 2.

FIG. 3 shows a more detailed view of a portion of the substrate processing apparatus 1 of FIG. 2. As described above, the column in a substrate processing apparatus is preferably vibrationally decoupled in such a way that only very low frequencies can couple into the column from the outside world. In particular in lithographic applications, the radiation generated by a radiation source is modulated before being projected in accordance with a predetermined pattern. To supply the pattern, one or more masks may be used. Alternatively, a pattern may be created by sending control data to deflectors which, in dependence of the control signal value that they receive, block a predetermined portion of radiation or allow that radiation portion to be projected on the substrate to be processed. Such control data may be sent via electric signals, but may also be sent optically, for example via optical fibers. Additionally, projecting charged particle beams such as electron beams requires the application of suitable voltages to components within the column.

Furthermore, the use of a mask and/or deflectors results in a generation of heat caused by the radiation that is blocked within the column. In view of the ever increasing demand for smaller structures, and the extremely high costs related to occupying space within a semiconductor production facility, there is often insufficient space for sufficient passive cooling. Therefore, in many cases, components within a lithographic apparatus are actively cooled, for example by a suitable supply of cooling fluid.

In FIG. 3, the area within the dashed lines represents a space 100 reserved for one or more of electrical wires, optical fibers and cooling conduits for abovementioned purposes. It will be clear that the supply lines should not jeopardize the beneficial design with respect to the vibrational decoupling. In other words, the supply lines should be arranged in such a way that vibrations coupling into the system also remain below the desired maximum frequency.

Figure 4:
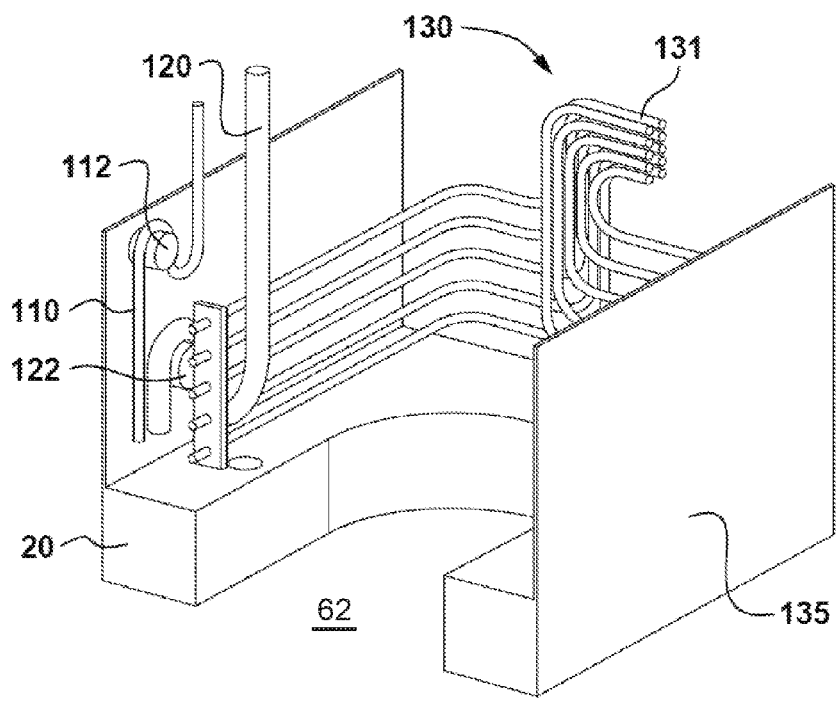
FIG. 4 shows an elevated side view of a support body.

FIG. 4 shows an elevated side view of a support body 62 provided with an arrangement to accommodate electrical wiring 110, optical fibers 120 and a cooling arrangement 130 comprising one or more fluid conduits. The radiation projection system is not shown to enhance clarity. The wiring 110, fibers 120 and cooling arrangement 130 are all provided within the space denoted by area 100 in FIG. 3.

In the embodiment of FIG. 4 the cooling arrangement 130 comprises a plurality of tubes 131. The tubes 131 are preferably rigid and attached to the support body 62 to avoid movement of the tubes 131 relative to the support body 62 due to varying amounts of fluid running through them. FIG. 4 merely shows an example of a configuration of tubes 131. As shown in FIG. 4, the tubes 131 may be grouped together.

The support body 62 is further provided with side walls 135, of which only two walls 140 are shown for clarity. The walls 135 may comprise a shielding material, such as a mu metal or the like, for shielding the radiation projection system 20 from external electromagnetic fields.

One or more of the side walls 135 may be provided with one or more protrusions 112, 122 arranged to enable draping the electrical wiring 110 and the optical fibers 120 respectively in such a way that the electrical wires 110 and the fibers 120 form a U-shaped bend at a height level below the respective protrusion 112, 122. By hanging the wires 110 and/or fibers 120 in such a way, vibrations will not reach the support body 62. The U-shaped bend effectively inhibits the vibrations to progress. Unfortunately, it is impossible to use a similar arrangement to inhibit vibrations to couple into the support body 62 via ordinary cooling tubes.

Figure 5:
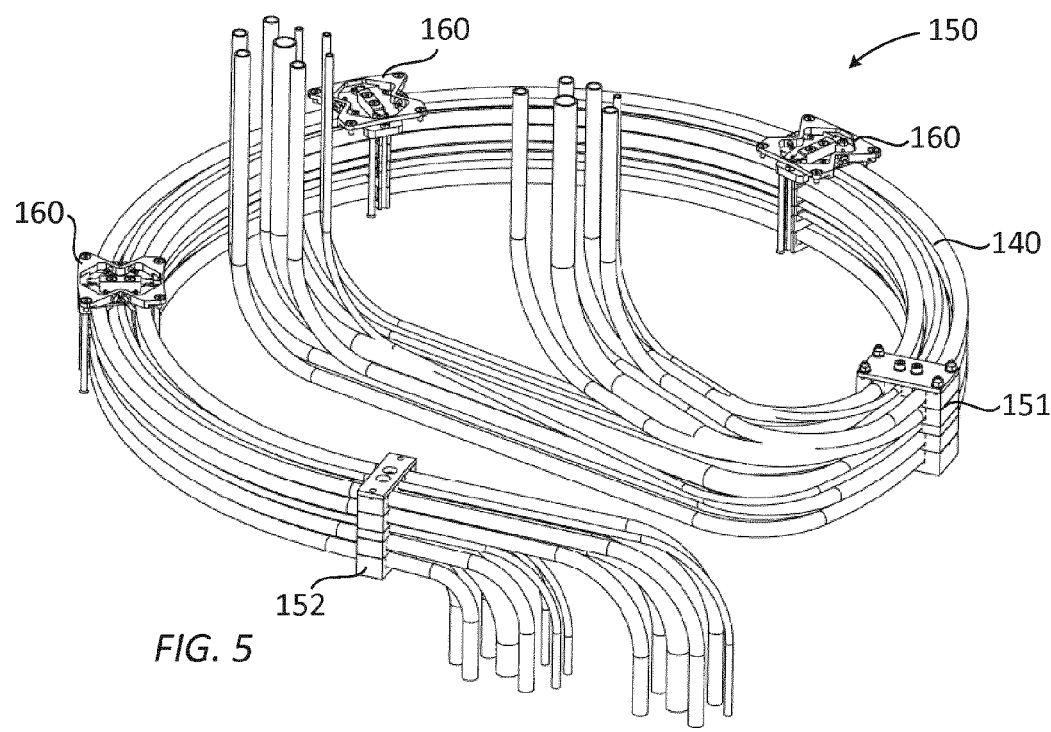
FIG. 5 schematically shows a fluid transfer system according to an embodiment of the invention.

FIG. 5 schematically shows a fluid transfer system 150 according to an embodiment of the invention. The fluid transfer system 150 is arranged for providing fluid to and removing fluid from the cooling arrangement of the radiation projection system 20. The fluid transfer system 150 comprises at least one tube 140 fixed at two points 151, 152 within the substrate processing apparatus 10. The points 151, 152 may be referred to as anchor points or fixed points 151, 152. The portion of the fluid transfer system 150 that is arranged for transferring fluid between the fixed points 151, 152 may be referred to as the flexible portion of the fluid transfer system 150.

In the fluid transfer system 150 depicted in FIG. 5 the system comprises a plurality of tubes 140 for providing fluid to the cooling arrangement, and another plurality of tubes 140 for removing fluid from the cooling arrangement. As will be explained with reference to FIG. 6, the tubes 140 for providing fluid and the tubes 140 for removing fluid may be specifically arranged to avoid heat transfer between the tubes 140. Alternatively, the fluid transfer system 150 may comprise only one tube 140, or merely one tube 140 for providing fluid to the cooling arrangement and merely one tube 140 for removing fluid from the cooling arrangement. In fact, any number of tubes 140 may be possible.

Figure 6:
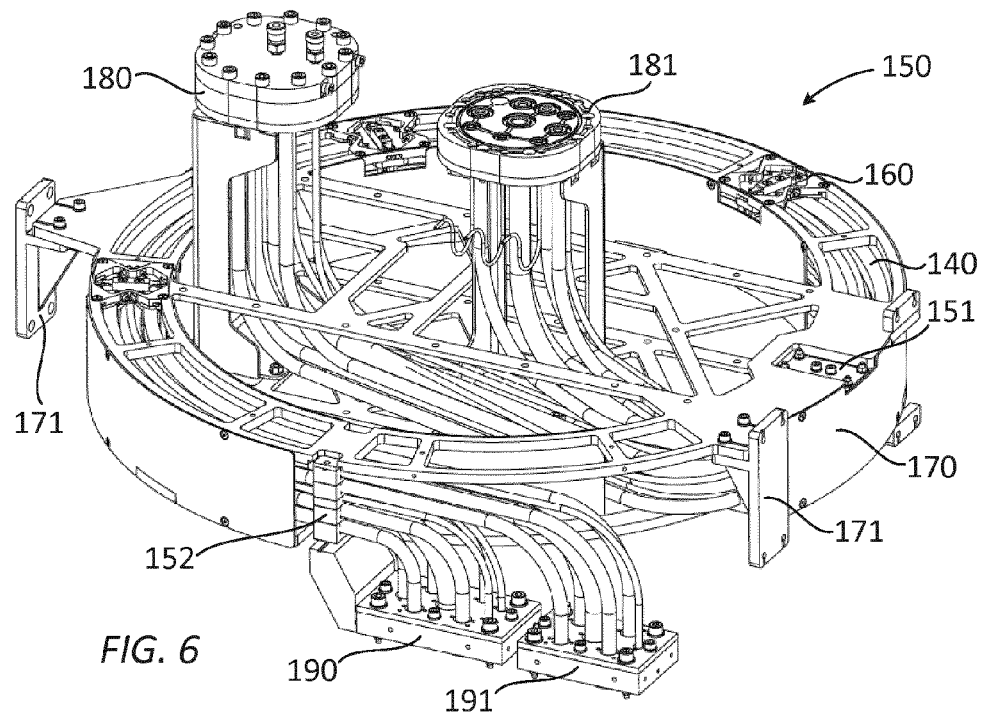
FIG. 6 schematically shows the fluid transfer system of FIG. 5 connected to a support frame.

The first anchor point 151 is preferably connected to the support frame 60 whereas the second anchor point 152 is preferably connected to the radiation projection system 20 which comprises the cooling arrangement. The main portions of the tubes 140 are arranged in curved fashion in a plane, preferably the xy-plane. The radius of curvature preferably coincides with the natural curvature tubes obtain while they are being manufactured. End portions of the tubes 140 have an orientation substantially perpendicular to the plane. In FIGS. 5 and 6, the tube end portions facing upwards are arranged for connection with the support frame 60, whereas the tube end portions facing downwards are arranged for connection with the cooling arrangement of the radiation projection system 20.

Because the tubes 140 do not form a straight connection between the anchor points 151, 152, but instead form a curved connection, in FIG. 5 in the form of a loop, vibrations are attenuated over a longer distance, which allows for more efficient vibration decoupling. The orientation of the tubes 140 in a curved fashion in a single plane allows for vibration attenuation in that plane. For example, in case the plane corresponds with the xy-plane, as preferably the case if the substrate processing apparatus corresponds to the apparatus depicted in FIG. 2, the curved tubing arrangement allows for attenuation of the vibrations in the x-direction, the y-direction, and the rotational direction substantially perpendicular to the xy-plane, i.e. the Rz-direction.

Figure 7:
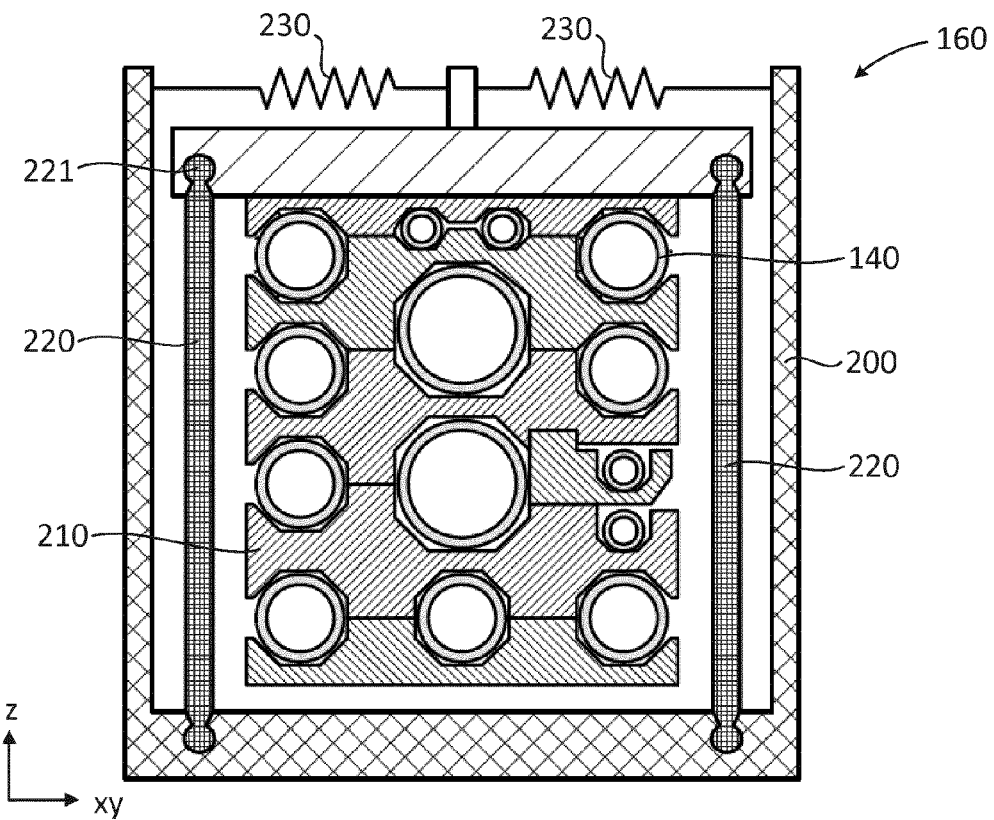
FIG. 7 schematically shows a suspension holder that may be used in the fluid transfer system of FIG. 5.

Preferably, the tubes 140 are supported by one or more suspension holders 160 along their trajectory between the anchor points 151, 152. The use of one or more suspension holders 160 reduces tube bending under the influence of gravity. As a result of such bending, one or more tubes may contact the support frame 60 or a structure connected thereto, which would eliminate the vibration decoupling. An embodiment of a suspension holder 160 is schematically depicted in FIG. 7.

By suitable selection of the type and number of tubes as well as the number of suspension holders, if any, the stiffness of the fluid transfer system may be defined such that vibrations above a predetermined maximum frequency as suppressed. In particular, in the embodiment depicted in FIG. 5, attenuation of vibrations in the x, y and Rz direction is progressively established over the entire length between anchor points 151 and 152. On the other hand, attenuation of vibrations in the Rx, Ry and z-directions effectively take place between the anchor point 152 and the suspension holder 160 closest to the anchor point 152. As a result, the predetermined maximum frequency that is allowed to advance to the radiation projection system may differ per vibration direction. In particular, in the embodiment depicted in FIG. 5 the predetermined maximum frequency in the x, y and Rz-directions is typically lower than the predetermined maximum frequency in the Rx, Ry and z-directions.

Suitable materials for the one or more tubes 140 would be perfluoroalkoxy (PFA) and polytetrafluoroethylene (PTFE), the latter being known under the trade name Teflon®. In this embodiment, PFA is preferred because it is melt-processable using conventional processing techniques including but not limited to injection molding and screw extrusion.

The use of curved tubes, preferably with a curvature that substantially corresponds to the curvature that is naturally provided to the tubes during manufacturing or fabrication, i.e. their "natural curvature", allows for attenuation of vibrations along a relatively long trajectory. In particular, the tubes may be oriented and placed in such a way that the fluid transfer system has a predetermined maximum stiffness. Preferably, the predetermined maximum stiffness is lower than 500 N/m, more preferably lower than 400 N/m. A low stiffness results in a reduced incoupling of vibrations. In particular, the cut-off frequency of vibrations that are coupled into the cooling arrangement is lower in case the maximum stiffness of the fluid transfer system is reduced.

Providing a predetermined stiffness for the flexible portion of the fluid transfer system may include different selections of suitable parameters and conditions. For example, the length, diameter and wall thickness of the one or more tubes 140 may be suitably selected. Alternatively, or additionally, the curvature of the one or more tubes 140 may be suitably selected. Furthermore, as the stiffness of the flexible portion may depend on the fluid that is transferred through the fluid transfer system during operational use, the fluid transfer system may comprise a fluid supply system for regulating parameters of the fluid flow in the fluid transfer system. Exemplary parameters include, but are not limited to fluid type, fluid volume and fluid pressure.

The fluid being transferred via the fluid transfer system towards and from the cooling arrangement may be liquid, a gas or a combination of the two. In many applications, water is a suitable cooling fluid.

FIG. 6 schematically shows the fluid transfer system 150 of FIG. 5 connected to an additional support frame 170. The additional support frame 170 is connected to the support frame 60 by via coupling structures 171. Furthermore, the additional support frame 170 is arranged to support the suspension holders 160 used to support the weight of the tubes 140. Furthermore, the additional support frame 170 may be used to outline the position of the fluid transfer system 150 within the substrate processing apparatus. The additional support frame 170 may be manufactured by cutting and bending plate material, for example aluminum, optionally in combination with welding techniques.

FIG. 6 further shows that the end portions of the tubes 140 facing upwards are connected with the support frame 60 via flanges 180 and 181, each flange preferably 180, 181 being arranged to accommodate solely tubes that transfer fluid towards or away from the radiation projection system 20 respectively. Similarly, the end portions of the tubes 140 facing downwards are connected to the radiation projection system 20, preferably to the cooling arrangement provided therein, via flanges 190 and 191. Again, each flange 190, 191 is preferably arranged to accommodate solely tubes that transfer fluid towards or away from the radiation projection system 20 respectively.

FIG. 7 schematically shows a suspension holder 160 that may be used in the fluid transfer system of FIG. 5. The suspension holder 160 comprising a frame 200 in which one or more support elements 210 are provided for supporting the one or more tubes 140. Preferably, multiple support elements 210 are used that can be connected in such a way that the support elements form a support structure provided with a plurality of holes for accommodating the tubes 140. The support structure is vibrationally decoupled in x, y and Rz-directions from the frame 200 by means of supporting poles 220 and spring elements 230. The supporting poles 220 have rounded ends 221 that allow for movement in the x, y and Rz-directions. The spring elements 230 may take the form of springs.

Preferably, the support elements 210 have dimensions that allow the creation of the support structure in a modular fashion. In such embodiment, first, the lowest support element 210 is provided on top of which one or more tubes are placed. Subsequently, a second support element 210 is placed on top of the lowest support element 210, thereby enclosing the tubes 140 already resting on the lowest support element 210. The second support element 210, in its turn, may be provided with recessions that allow placement of further tubes 140. Then a third support element 210 may be placed on top of the second support element 210 to enclose the tubes 140 that are placed in the recessions of the second support element 210. This stacking of support elements 210 continues until all tubes are suitably enclosed as depicted in FIG. 7.

Preferably, in case tubes 140 of different diameter are used, the tubes with largest diameter are supported at a relatively centered position, whereas tubes 140 with a smaller diameter may be located near the edge of the support structure. Such allocation of tubes results in a more stable structure.

Preferably, the holes in the support structure for allowing the tubes to pass therethrough are of such dimensions that the tubes may move somewhat in a transverse direction within the holes. In other words, in some embodiments, the tubes do not fit tightly in the holes, but rather fit loosely. In particular if the curvature of a tube differs from its natural curvature, resilient forces may occur which may move the tube slight inwards or outwards. If the tubes would fit tightly, such sideways transfer could result in a similar movement of the support structure of the suspension holder 160, which, in its turn, may result in contact between the suspension holder 160 and the support frame 60 or a structure connected thereto, for example additional support frame 170. Consequently, the vibrational decoupling of the support structure would be eliminated.

Figure 8:
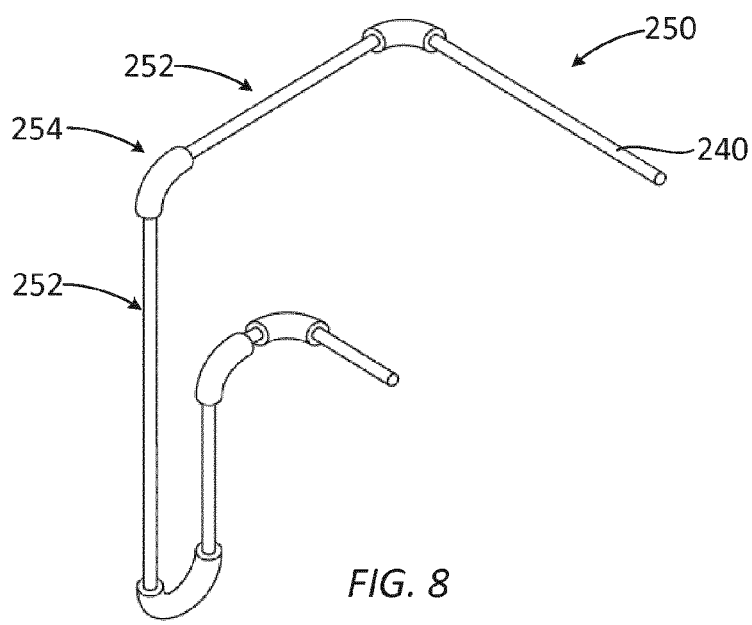
FIG. 8 schematically shows a fluid transfer system according to another embodiment of the invention.

FIG. 8 schematically shows a fluid transfer system 250 according to another embodiment of the invention. The fluid transfer system 250 is arranged for providing fluid to and removing fluid from the cooling arrangement of the radiation projection system 20 and comprises at least one tube 240 fixed at two points within the substrate processing apparatus 10. The tube 240 comprises at least two straight portions 252 and at least one corner portion 254 between the two points. The straight portions 252 are flexible compared to the one or more corner portions 254. In other words, the one or more corner portions 254 have a higher stiffness than the straight portions 252.

The straight portions 252 make up the largest part of the tube 240, i.e. sum of the lengths of the straight portions 252 exceeds 50% of the length of the tube 240. Preferably the sum of the lengths of the straight portions 252 makes up at least 70% of the length of the tube 240. Consequently, the tube 240 is mostly flexible, but stiff in the corners. The flexible straight portions 252 within the fluid transfer system 250 enable attenuation of vibrations progressing towards the support body 62 above a predetermined maximum frequency. The one or more stiff corner portions 254 are capable of sustaining pressure increases, which for example may avoid straightening of the tube 240 due to fluid running through the tube. Suitable materials for the one or more tubes 140 would again be perfluoroalkoxy (PFA) and polytetrafluoroethylene (PTFE), the latter being known under the trade name Teflon®.

The use of one or more tubes having straight portions 252 and one or more corner portions 254 provides design freedom with respect to the stiffness of the fluid transfer system. In particular, the fluid transfer system may be designed to have a predetermined maximum stiffness. Preferably, the predetermined maximum stiffness is smaller than 500 N/m. Providing a predetermined maximum stiffness may involve similar selections and considerations discussed with reference to the embodiment shown in FIG. 5.

The fluid being transferred via the fluid transfer system towards and from the cooling arrangement may be liquid, a gas or a combination of the two. In many applications, water is a suitable cooling fluid.

Figure 9:
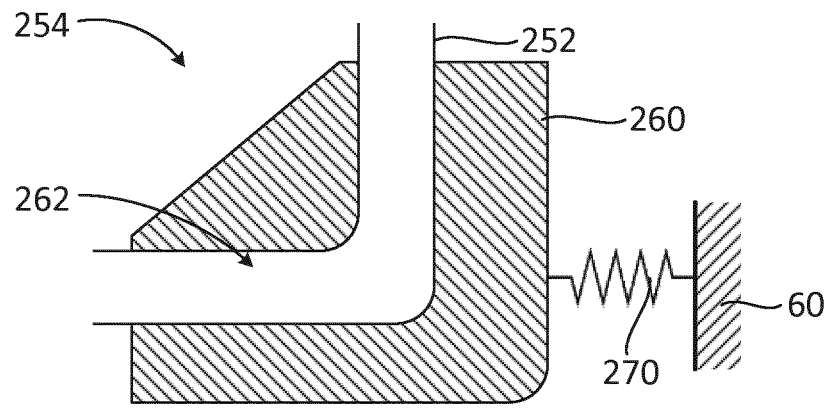
FIG. 9 schematically shows a cross-sectional view of an embodiment of a corner portion for use in the fluid transfer system of FIG. 8.

FIG. 9 schematically shows a cross-sectional view of an embodiment of a corner portion 254 for use in the fluid transfer system of FIG. 8. The corner portion 254 comprises a stiffening member 260. The stiffening member 260 is a structure provided with a hollow opening 262 in the shape of a bended tube. Preferably, the hollow opening 262 accommodates the tube 240 and guides the tube around a corner. Alternatively, the hollow opening 262 can be used as a conduit to which straight portions 252 of the tube are attached. The stiffening member 260 prevents the tube from straightening due to fluid running through the tube. The stiffening member 260 is preferably made of a non-magnetic material. Furthermore, the material preferably enables easy manufacturing and is a material of limited weight. A suitable material for the stiffening member 260 is aluminum.

The stiffening member 260 may be connected to the support frame 60 by means of a spring element 270. Such connection provides structural integrity to the cooling transfer system 250 within the substrate processing apparatus, while limiting the influence of external vibrations. The size and shape of the spring element 270 depends on the desired structural integrity and the requirements regarding the (frequencies of the) vibrations that are to be attenuated.

FIGS. 8 and 9 show a fluid transfer system 250 with a single tube 240. However, in some embodiments, the fluid transfer system 250 comprises a plurality of tubes. In such system 250, each tube may be arranged as shown in FIGS. 8 and 9, i.e. fixed at two points and comprising at least two relatively flexible straight portions and at least one relatively stiff corner portion between the two points.

Figure 10:
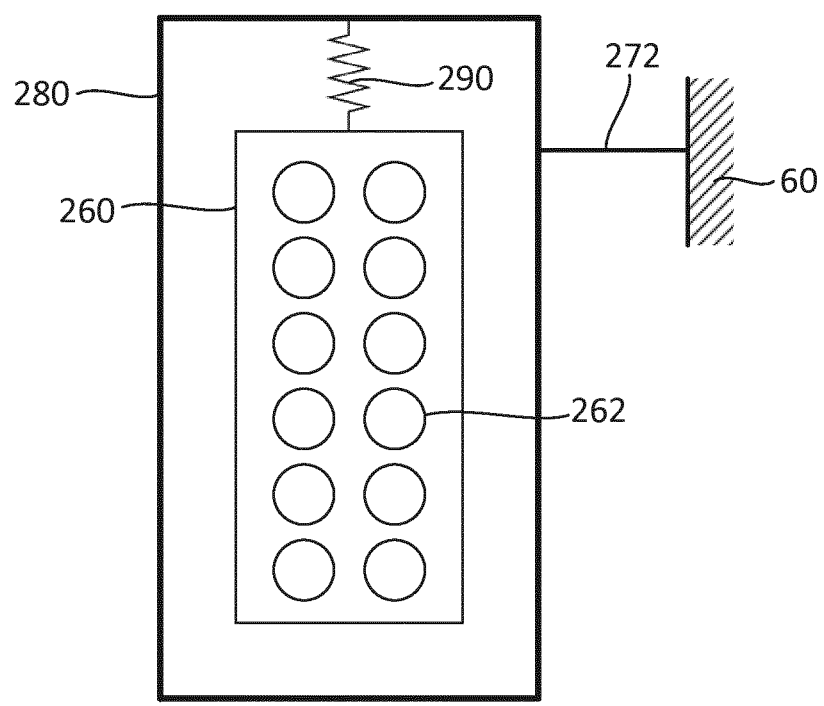
FIG. 10 schematically shows a cross-sectional view of an embodiment of a stiffening member that may be used in the fluid transfer system of FIG. 8.

FIG. 10 schematically shows a cross-sectional view of an embodiment of a stiffening member 260 that may be used in embodiments of the invention in which the fluid transfer system 250 comprises a plurality of tubes, such as the fluid transfer system of FIG. 8. The stiffening member 260 is provided with a plurality of openings 262 for guiding fluid in a desired direction. Similar to the embodiment shown in FIG. 9, the openings 262 may either be used as conduits for guiding the fluid, or they may accommodate a portion of the tubes 240.

The fluid transfer system 250 may be surrounded by a tubular housing 280. The tubular housing 280 may be used to protect the fluid transfer system 250. Furthermore, in case the fluid transfer system 250 is provided in a vacuum environment, for example in a vacuum chamber 50 as shown in FIG. 2, the tubular housing 280 may be arranged for blocking particles emitted from the tubes 240 from entering into the vacuum. Preferably, the tubes 240 do not directly contact the housing 280. The stiffening members 260 are connected to the housing 280, preferably via one or more spring elements 290 to ensure vibrational decoupling from the environment. The tubular housing 280 is preferably relatively stiff, and is preferably rigidly connected to the support frame 60 via a connection 272 to provide sufficient structural integrity to the tubular housing 280.

Alternatively, the tubular housing 280 may be connected to the support frame 60 via one or more spring elements, such as spring elements 270. In such case, the stiffness of the spring elements 270 and 290 is to be properly tuned to achieve an effective vibrational decoupling of the stiffening member 260 from the support frame 60.

Figure 11:
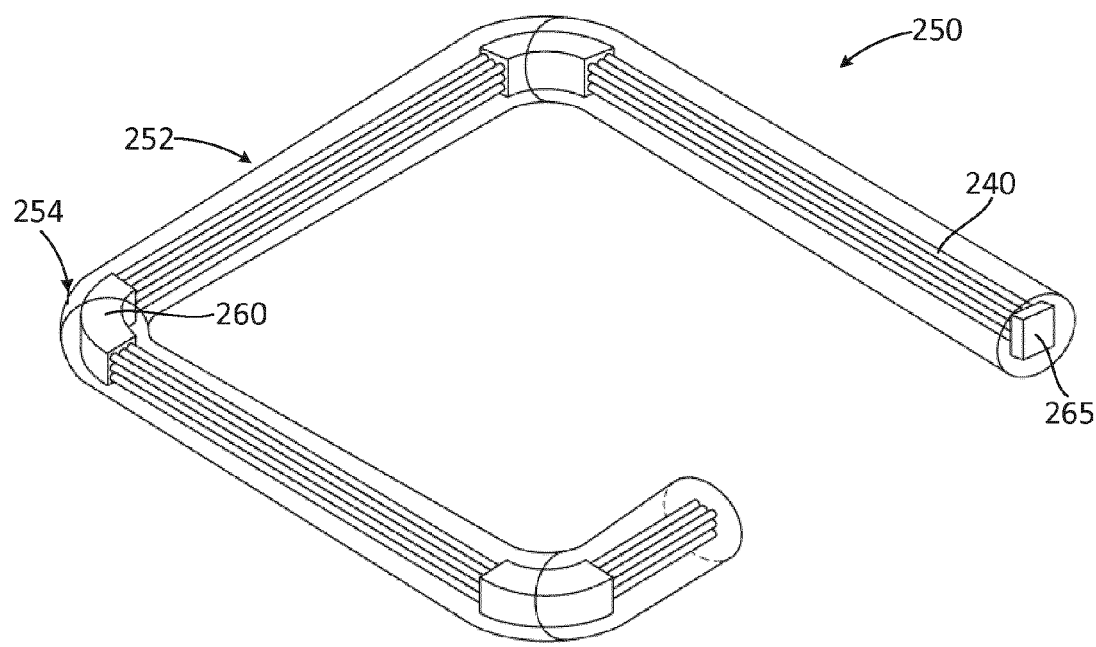
FIG. 11 schematically shows an elevated side view of a fluid transfer system according to yet another embodiment of the invention.

FIG. 11 shows an elevated side view of a fluid transfer system 250 within a tubular housing 280. The system 250 comprises a plurality of tubes 240. The straight portions 252 of each tube are free of contacting straight portions of other tubes 240. As a result, vibrations within neighboring tubes 240 have a negligible effect on the vibration attenuation performance of a tube 240. In addition to stiffening members 260 in corner portions 254 of the tubes 240, the fluid transfer system 250 comprises a further stiffening member 265 at an end of the tubes. The further stiffening member 265 fixates the connection positions of the fluid transfer system 250 at its end points. For example, the further stiffening member 265 may be used to fixate the end points of the tubes 240 of the fluid transfer system for connection to corresponding conduits within the cooling arrangement 230 of the radiation projection system 20. The further stiffening member 265 may be similar to stiffening member 260. However, the one or more openings 262 do not necessarily have a curved portion for guiding fluid around a corner.

Figure 12:
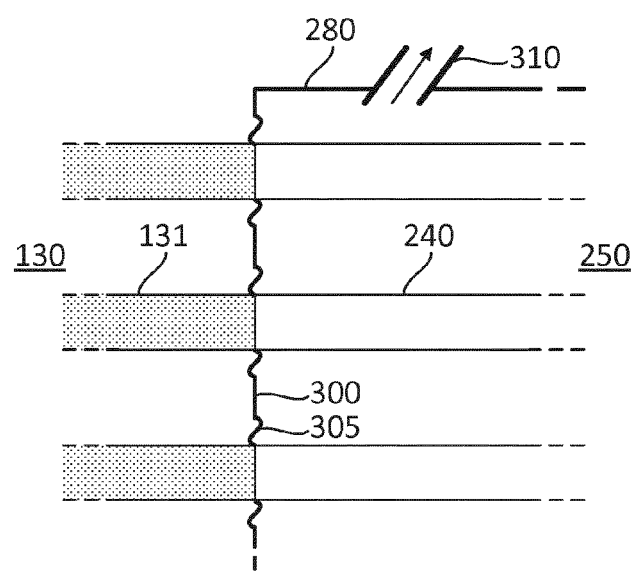
FIG. 12 schematically shows a cross-sectional view of an embodiment of a connection between the fluid transfer system of FIG. 11 with a cooling arrangement.

FIG. 12 schematically shows a cross-sectional view of a connection of a fluid transfer system 250 with a cooling arrangement 230 according to an embodiment of the invention. In the embodiment depicted in FIG. 12, the fluid transfer system 250 comprises a plurality of tubes 240 surrounded by a housing 280. The housing 280 is preferably shaped in a way substantially corresponding to the shape formed by the plurality of tubes 240. In the shown embodiment, the housing thus takes the form of a tubular housing 280.

The cooling arrangement 230 comprises a corresponding plurality of tubes 231. The way in which the tube ends of the cooling arrangement and the tube ends of the fluid transfer system 250 are connected to each other is not explicitly shown. However, it will be understood that this may be done in a way generally known in the art. The tubular housing 280 is provided with a membrane 300. The membrane 300 is arranged for separating a space within the tubular housing 280 from external influences, in particular from a vacuum environment. The membrane 300 is provided with one or more openings through which the one or more tubes of the fluid transfer system 250 protrude.

In case the cooling arrangement 230 is subjected to a vacuum environment, particles created within the tubular housing 280, for example due to outgassing, may leak towards the vacuum environment via the membrane openings. To reduce such leakage, the tubular housing 280 is preferably provided with an outlet 310 that may be connected to a pump, preferably a vacuum pump. Alternatively, or additionally, leakage is reduced by providing flexible portions 305 to positions in close proximity of or at the edges of the membrane openings. The flexible portions 305 extend from the membrane 300 onto the tubes forming a weak seal. The flexible portions 305 reduce the size of the openings, and may therefore further reduce leakage of particles from the internal space of the housing 280 towards the vacuum environment. Furthermore, since the portions 305 form a weak seal, the advancement of any undesired vibrations via the housing 280 and the membrane 300 towards the radiation projection system is avoided.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. Substrate processing apparatus, comprising:
    a support frame;
    a radiation projection system for projecting radiation onto a substrate to be processed, the radiation projection system comprising a cooling arrangement and being supported by the support frame via one or more pendulums, so that the radiation projection system and the cooling arrangement are moveable relative to the support frame and are vibrationally decoupled from the support frame, such that vibrations of the support frame above a predetermined maximum frequency are substantially decoupled from the radiation projection system and the cooling arrangement;
    a substrate support structure provided with a surface for supporting the substrate to be processed; and
    a fluid transfer system for providing fluid to and removing fluid from the cooling arrangement of the radiation projection system, wherein the fluid transfer system comprises at least one tube, a first fixation element and a second fixation element, wherein the at least one tube is fixed at least by the first and second fixation elements at a first fixed point and a second fixed point within the apparatus,
    wherein the said at least one tube of the fluid transfer system comprises a flexible portion extending between the first and second fixed points, the first fixed point being fixed relative to the support frame, and the second fixed point being fixed relative to the radiation projection system and to said cooling arrangement, wherein the first and second fixed points and at least a substantial part of the flexible portion are arranged in a same plane substantially parallel to the surface of the substrate support structure, so that the flexible portion extends substantially along a curve in the same plane substantially parallel to the surface of the substrate support structure so as to attenuate vibrations in the plane and between the first fixed point and the second fixed point, and wherein the stiffness of the flexible portion between the two points is adapted to substantially decouple vibrations at the second fixed point which are above the predetermined maximum frequency from the first fixed point.

2. Apparatus according to claim 1, wherein the length, diameter, and wall thickness of the at least one tube is selected to provide a predetermined stiffness of the flexible portion of the fluid transfer system.

3. Apparatus according to claim 1, wherein the fluid transfer system further comprises a fluid supply system for regulating the volume and pressure of fluid in the fluid transfer system to provide a predetermined stiffness of the flexible portion of the fluid transfer system.

4. Apparatus according to claim 1, wherein the support frame, the radiation projection system, the substrate support structure, and the fluid transfer system are placed in a vacuum chamber.

5. Apparatus according to claim 1, wherein the at least one tube is oriented in a curved fashion in the plane in the form of a loop.

6. Apparatus according to claim 5, wherein the at least one tube has a curvature corresponds with the natural curvature of the at least one tube obtained during fabrication thereof.

7. Apparatus according to claim 5, further comprising a support structure for holding the at least one tube at a location along its length.

8. Apparatus according to claim 7, wherein the support structure is vibrationally decoupled from the support frame for vibrations in a direction within a plane substantially parallel to the surface of the substrate support structure for supporting the substrate to be processed, as well as in a direction about an axis substantially perpendicular to the plane.

9. Apparatus according to claim 8, wherein the support structure is included in a suspension holder comprising a frame connected to the support structure by means of at least two supporting poles and one or more spring elements.

10. Apparatus according to claim 9, wherein the fluid transfer system comprises a plurality of tubes, each tube being fixed at the first and second fixed points and each tube being oriented in a curved fashion in a plane substantially parallel to the surface of the substrate support structure for supporting the substrate to be processed, and wherein the support structure is arranged for holding the plurality of tubes at a location along their length such that the tubes do not contact each other.

11. Apparatus according to claim 10, wherein the tubes have different diameters, and wherein the tubes of larger diameter are more centrally supported by the support structure.

12. Apparatus according to claim 10, further comprising an additional support frame connected to the support frame for supporting the at least one suspension holder.

13. Apparatus according to claim 5, wherein end portions of the at least one tube are oriented in a direction substantially perpendicular to the plane of the surface of the substrate support structure for supporting the substrate to be processed.

14. Apparatus according to claim 1, wherein the at least one tube of the fluid transfer system comprises at least two straight portions and at least one corner portion between the two points, wherein the at least two straight portions are flexible compared to the at least one corner portion, and wherein the lengths of the straight portions make up a largest part of the length of the at least one tube.

15. Apparatus according to claim 14, wherein the straight portions of each tube are free of contacting straight portions of other tubes.

16. Apparatus according to claim 14, wherein the at least one corner portion comprises a stiffening member provided with an opening for transferring fluid around a corner.

17. Apparatus according to claim 16, wherein the stiffening member is connected to the support frame by means of a spring element.

18. Apparatus according to claim 1, further comprising:
a support body for accommodating the radiation projection system; and
an intermediate body connected to the support frame by means of at least one spring element;
wherein the support body is connected to the intermediate body by means of at least one pendulum rod.

19. Apparatus according to claim 18, wherein the support body is provided with side walls surrounding the radiation projection system, the side walls comprising a shielding material for shielding the radiation projection system from external electromagnetic fields.

20. Apparatus according to claim 19, wherein the radiation projection system forms part of a multi-beamlet charged particle lithographic apparatus, the multi-beamlet charged particle lithographic apparatus further comprising:
a beam generator for generating a plurality of charged particle beamlets;
a beamlet blanker array for patterning the plurality of beamlets in accordance with a pattern; and
a projection system for projecting the patterned beamlets onto a target surface of a substrate provided on the target support structure.

21. Apparatus according to claim 1, wherein said at least one tube of said fluid transfer system comprises a first end portion and a second end portion, said first and second end portions being oriented in a direction with an angle with respect to the plane, and wherein said first end portion is connected to the support frame and said second end portion is connected to the radiation projection system.

22. Apparatus according to claim 1, wherein the at least one tube comprises an end portion extending substantially along a center line of the radiation projection system.

23. A fluid transfer system for providing fluid to and removing fluid from a cooling arrangement, the fluid transfer system comprising:
a tube;
a first fixation element for fixing the tube to a support frame; and
a second fixation element for fixing the tube to the cooling arrangement, the support frame arranged to support the cooling arrangement via one or more pendulums,
wherein the tube is fixed by the first and second fixation elements at a first fixed point and a second fixed point, the tube having a flexible portion extending between the first and second fixed points; and
wherein the first and second fixation elements are moveable with respect to each other, and wherein the first and second fixed points and at least a substantial part of the flexible portion are arranged in a same plane, so that the flexible portion extends substantially along a curve in the same plane so as to attenuate vibrations in the plane and between the first fixed point and the second fixed point, and wherein the stiffness of the flexible portion between the two points is adapted to substantially decouple vibrations at the second fixed point which are above a predetermined maximum frequency from the first fixed point.

24. The fluid transfer system according to claim 23, wherein said plane corresponds to an x,y plane, and wherein said one or more tubes are arranged for attenuating vibrations in the x-direction, in the y-direction, and the rotational direction Rz substantially perpendicular to said plane.

25. The fluid transfer system according to claim 23, wherein the flexible portion extends in a curved fashion in the form of a loop in the plane.

26. The fluid transfer system according to claim 25, wherein the flexible portion is adapted to attenuate vibrations in said plane over the entire length between said first point and said second point.

27. Apparatus according to claim 25, wherein the at least one tube comprises an end portion extending substantially along a center axis of the loop.

28. The fluid transfer system according to claim 23, comprising one or more suspension holders arranged along the portion of said one or more tubes extending between the first and second points, each suspension holder being arranged for supporting the one or more tubes at a location along its length, to reduce bending under the influence of gravity.

29. The fluid transfer system according to claim 28, wherein attenuation of vibrations in the x, y, and Rz direction is established between said first point and the suspension holder of said one or more suspension holder being located closest to said first point.

30. The fluid transfer system according to claim 28, further comprising a fluid transfer system support frame comprising coupling structures for connecting the fluid transfer system support frame to a support frame of a substrate processing apparatus, the fluid transfer support frame being configured to support said one or more suspension holders.

31. The fluid transfer system according to claim 23, wherein each of said one or more suspension holders comprises a suspension holder frame and one or more supporting elements for supporting said one or more tubes, said supporting elements being vibrationally decoupled from said suspension holder frame.

32. The fluid transfer system according to claim 23, further comprising a first end portion and a second end portion, said first and second end portions being oriented in a direction with an angle with respect to the plane.

33. Substrate processing apparatus comprising:
a support frame;
a radiation projection system for projecting radiation onto a substrate to be processed, the radiation projection system comprising a cooling arrangement and being supported by the support frame via one or more pendulums, so that the radiation projection system and the cooling arrangement are moveable relative to the support frame and are vibrationally decoupled from the support frame, such that vibrations of the support frame above a predetermined maximum frequency are substantially decoupled from the radiation projection system and the cooling arrangement; and
a fluid transfer system according to claim 23,
wherein the first fixation element is coupled to the support frame, and the second fixation element is coupled to the radiation projection system, and
wherein the fluid transfer system is arranged to supply fluid to the cooling arrangement, and to remove fluid from the cooling arrangement.

* * * * *